(12) United States Patent
Lee

(10) Patent No.: US 10,671,228 B2
(45) Date of Patent: Jun. 2, 2020

(54) DISPLAY DEVICE INCLUDING MESH LINES OVERLAPPING CONTACT HOLES

(71) Applicant: SAMSUNG DISPLAY CO., LTD., Yongin-si, Gyeonggi-Do (KR)

(72) Inventor: Dukjin Lee, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/273,243

(22) Filed: Feb. 12, 2019

(65) Prior Publication Data

US 2019/0250738 A1 Aug. 15, 2019

(30) Foreign Application Priority Data

Feb. 13, 2018 (KR) .................... 10-2018-0017976

(51) Int. Cl.
*G06F 3/044* (2006.01)
*H01L 27/32* (2006.01)
*G06F 3/041* (2006.01)
*H01L 51/52* (2006.01)

(52) U.S. Cl.
CPC ............ *G06F 3/044* (2013.01); *G06F 3/0412* (2013.01); *G06F 3/0443* (2019.05); *G06F 3/0446* (2019.05); *H01L 27/323* (2013.01); *H01L 27/3248* (2013.01); *G06F 2203/04111* (2013.01); *G06F 2203/04112* (2013.01); *H01L 51/5218* (2013.01); *H01L 51/5234* (2013.01)

(58) Field of Classification Search
CPC ...... G06F 3/044; G06F 3/0443; G06F 3/0446; G06F 2203/04112; H01L 27/323; H01L 27/3248

See application file for complete search history.

(56) References Cited

U.S. PATENT DOCUMENTS

| 2015/0029135 A1* | 1/2015 | Han | G06F 3/0412 345/174 |
| 2016/0378224 A1* | 12/2016 | Kwon | H01L 51/5256 345/174 |
| 2017/0185180 A1* | 6/2017 | Chae | G06F 3/0412 |

(Continued)

FOREIGN PATENT DOCUMENTS

| KR | 10-2015-0069712 | 6/2015 |
| KR | 10-2017-0089467 | 6/2017 |

*Primary Examiner* — Michael Pervan
(74) *Attorney, Agent, or Firm* — F. Chau & Associates, LLC

(57) ABSTRACT

A display device includes; a display unit including a plurality of light emitting areas, a plurality of thin film transistors, and organic light emitting elements; an input sensing unit including a plurality of sensing electrodes and disposed on the display unit, wherein the plurality of sensing electrodes includes a plurality of openings; and an anti-reflection member. Each of the organic light emitting elements includes: a first electrode disposed above a first thin film transistor of the thin film transistors and connected to the first thin film transistor through a contact hole; a light emitting layer disposed on the first electrode and overlapping a first light emitting area of the light emitting areas; and a second electrode. Each of the light emitting areas is exposed by a corresponding opening of the plurality of openings, and the plurality of sensing electrodes overlaps with the contact holes.

20 Claims, 9 Drawing Sheets

(56) References Cited

U.S. PATENT DOCUMENTS

| | | | |
|---|---|---|---|
| 2017/0205959 A1* | 7/2017 | Seong | G06F 3/0412 |
| 2017/0212629 A1 | 7/2017 | Cho et al. | |
| 2017/0317145 A1 | 11/2017 | Hong et al. | |
| 2017/0353181 A1* | 12/2017 | Kim | H03K 17/962 |
| 2017/0364194 A1* | 12/2017 | Jang | G06F 3/0412 |
| 2018/0095570 A1* | 4/2018 | Hong | G06F 3/0412 |
| 2019/0204952 A1* | 7/2019 | Han | G06F 3/0412 |

* cited by examiner

DISPLAY DEVICE INCLUDING MESH LINES OVERLAPPING CONTACT HOLES

CROSS-REFERENCE TO RELATED APPLICATION

This U.S. non-provisional patent application claims priority under 35 U.S.C. § 119 to Korean Patent Application No. 10-2018-0017976, filed on Feb. 13, 2018, the disclosure of which is incorporated by reference herein in its entirety.

TECHNICAL FIELD

The present inventive concept relates to a display device, and more particularly, to a display device including mesh lines overlapping contact holes.

DISCUSSION OF THE RELATED

Flat display devices are widely used in the electronics industry because they may be relatively small, thin, and lightweight and may use a relatively small amount of power. A common type of flat display device is a liquid crystal display device that may be used in medium and large sized display devices such as monitors and televisions. Another common type of flat display device is an organic light emitting display device that may be used in portable display devices such as mobile phones and smart phones.

When the flat display device is used in the portable display device, the flat display device may include a window substrate covering a display panel. Optionally, the flat display device may further include a touch screen panel which detects a touch input of a user and converts the detected touch input into an electrical signal. However, when the window substrate or the touch screen panel is disposed on the display panel, external light provided from the outside may be reflected by the window substrate or the touch screen panel and may create a glare or may otherwise hinder viewing of the device.

SUMMARY

According to an exemplary embodiment of the present inventive concept, a display device includes: a display unit including a plurality of light emitting areas, a plurality of thin film transistors, and a plurality of organic light emitting elements; an input sensing unit including a plurality of sensing electrodes and disposed on the display unit, wherein the plurality of sensing electrodes includes a plurality of openings; and an anti-reflection member disposed on the input sensing unit. Each of the plurality of organic light emitting elements includes: a first electrode disposed above a first thin film transistor of the plurality of thin film transistors and connected to the first thin film transistor through a contact hole; a light emitting layer disposed on the first electrode and overlapping a first light emitting area of the plurality of light emitting areas; and a second electrode covering the light emitting layer. Each of the light emitting areas is exposed by a corresponding opening of the plurality of openings of the plurality of sensing electrodes, and the plurality of sensing electrodes overlaps with the contact holes.

In an exemplary embodiment of the present inventive concept, a reflectance of the plurality of sensing electrodes is less than a reflectance of the first electrode.

In an exemplary embodiment of the present inventive concept, each of the plurality of sensing electrodes includes copper, titanium, and/or aluminum, In an exemplary embodiment of the present inventive concept, the plurality of sensing electrodes includes: first sensing electrodes arranged in a first direction; and second sensing electrodes insulated from the first sensing electrodes and arranged in a second direction intersecting the first direction.

In an exemplary embodiment of the present inventive concept, each of the first sensing electrodes includes: a plurality of first sensor patterns arranged in the second direction; and first connection patterns. Each of the first connection patterns is disposed between the first sensor patterns adjacent to each other and connects the first sensor patterns to each other, and each of the second sensing electrodes includes; a plurality of second sensor patterns arranged in the first direction; and second connection patterns. Each of the second connection patterns is disposed between the second sensor patterns adjacent to each other and connects the second sensor patterns to each other.

In an exemplary embodiment of the present inventive concept, each of the first and second sensor patterns includes: a plurality of first mesh lines; and a plurality of second mesh lines intersecting the first mesh lines, and the openings are formed by the first and second mesh lines.

In an exemplary embodiment of the present inventive concept, a width of each of the first and second mesh lines is equal to or greater than a width of the contact hole.

In an exemplary embodiment of the present inventive concept, each area where a first mesh line of the plurality of first mesh lines intersects a second mesh line of the plurality of second mesh lines is an intersection area, and the intersection area overlaps with the contact hole.

In an exemplary embodiment of the present inventive concept, an area of the intersection area is equal to or greater than an area of the contact hole.

In an exemplary embodiment of the present inventive concept, a width of a first portion of each of the first and second mesh lines in the intersection area is greater than a width of a second portion of each of the first and second mesh lines adjacent to the intersection area.

In an exemplary embodiment of the present inventive concept, each of the first and second sensing electrodes further includes; a plurality of cover electrodes. Each cover electrode is disposed on each intersection area and covers each intersection area.

In an exemplary embodiment of the present inventive concept, each of the cover electrodes has a circular shape.

In an exemplary embodiment of the present inventive concept, the first sensor patterns and the second sensor patterns are disposed on the same layer.

In an exemplary embodiment of the present inventive concept, the first connection patterns are disposed on a layer different from a layer on which the first sensor patterns are disposed, and each of the first connection patterns is connected to the first sensor patterns through connection contact holes.

In an exemplary embodiment of the present inventive concept, the anti-reflection member includes: a phase retardation layer retarding a phase of a component of incident light; and a polarizing layer disposed on the phase retardation layer and absorbing a component of incident light.

According to an exemplary embodiment of the present inventive concept, a display device includes: a display unit configured to display an image and including a plurality of light emitting areas; a plurality of sensing electrodes disposed on the display unit, wherein each of the plurality of sensing electrodes includes a plurality of mesh lines; and an anti-reflection member disposed on the plurality of sensing electrodes and absorbs light reflected by the display unit. The display unit includes: a plurality of thin film transistors; a first electrode connected to each of the plurality of thin film transistors through a contact hole; a second electrode disposed on the first electrode; and a light emitting layer disposed between the first electrode and the second electrode and overlapping a light emitting area of the plurality of light emitting areas. Each of the plurality of mesh lines is disposed between the light emitting areas, and the contact hole is covered by the mesh lines.

In an exemplary embodiment of the present inventive concept, the mesh lines include: a plurality of first mesh lines extending in a first direction; and a plurality of second mesh lines extending in a second direction intersecting the first mesh lines and the first direction. Areas where a first mesh line of the plurality of first mesh lines intersects a second mesh line of the plurality of second mesh lines are intersection areas. One of the intersection areas overlaps with the contact hole.

In an exemplary embodiment of the present inventive concept, each of the plurality of sensing electrodes further includes: a plurality of cover electrodes disposed on the first mesh lines and the second mesh lines and covering the intersection areas.

In an exemplary embodiment of the present inventive concept, a width of a first portion of each of the first and second mesh lines in each intersection area is greater than a width of a second portion of each of the first and second mesh lines adjacent to the intersection area.

In an exemplary embodiment of the present inventive concept, a reflectance of each of the plurality of sensing electrodes corresponding to the intersection areas is less than a reflectance of the first electrode.

BRIEF DESCRIPTION OF THE DRAWINGS

A more complete appreciation of the present disclosure and many of the attendant aspects thereof will be readily obtained as the same becomes better understood by reference to the following, detailed description when considered in connection with the accompanying drawing, wherein.

DETAILED DESCRIPTION OF THE EMBODIMENTS

Figure 1:
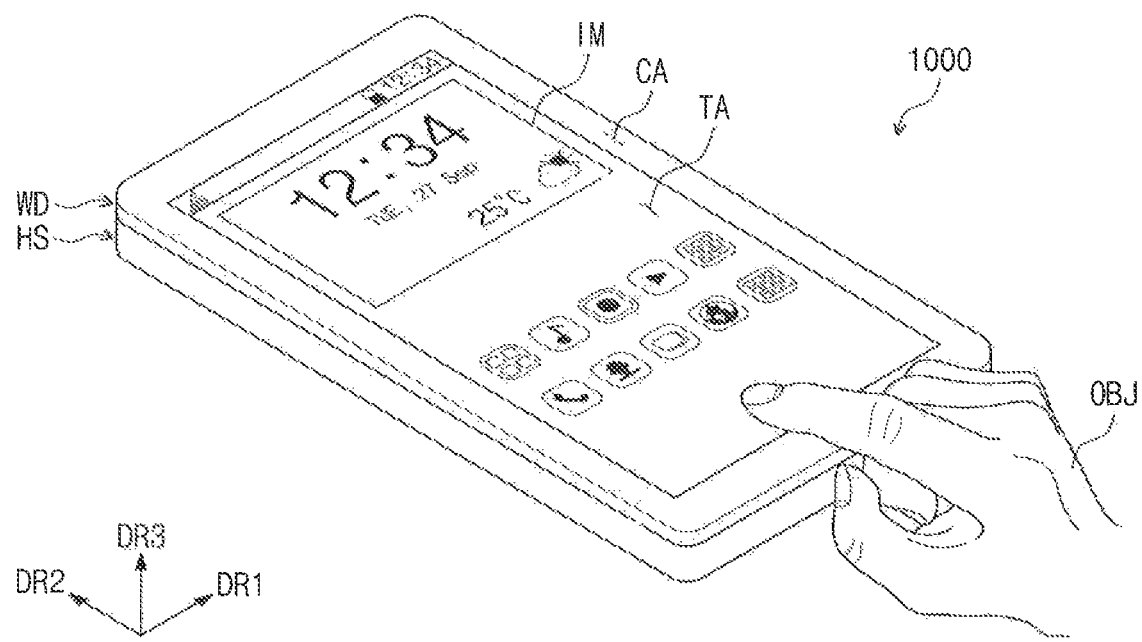
FIG. 1 is a perspective view illustrating a display device according to an exemplary embodiment of the present inventive concept.

Exemplary embodiments of the present inventive concept now will be described more fully hereinafter with reference to the accompanying drawings. It is to be understood that the present inventive concept may, however, be embodied in different forms and, thus, should not be construed as being limited to the exemplary embodiments set forth herein. In the drawings, like reference numerals may refer to like elements.

It will be understood that when an element such as a layer, region or substrate is referred to as being "on" another element, it can be directly on the other element or intervening elements may be present.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, the term "below" can encompass both an orientation of above and below. The device may be otherwise oriented (e.g., rotated 90 degrees or at other orientations) and the spatially relative descriptors used herein may be interpreted accordingly.

It will be understood that, although the terms "first", "second", etc, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present inventive concept.

In the drawings, sizes and thicknesses of elements, layers and regions may be exaggerated for clarity. For example, since sizes and thicknesses of elements, layers and regions in the drawings may he exaggerated for clarity, the following exemplary embodiments of the present inventive concept are not limited thereto.

Hereinafter, exemplary embodiments of the present inventive concept will be described more fully with reference to the accompanying drawings.

Figure 2:
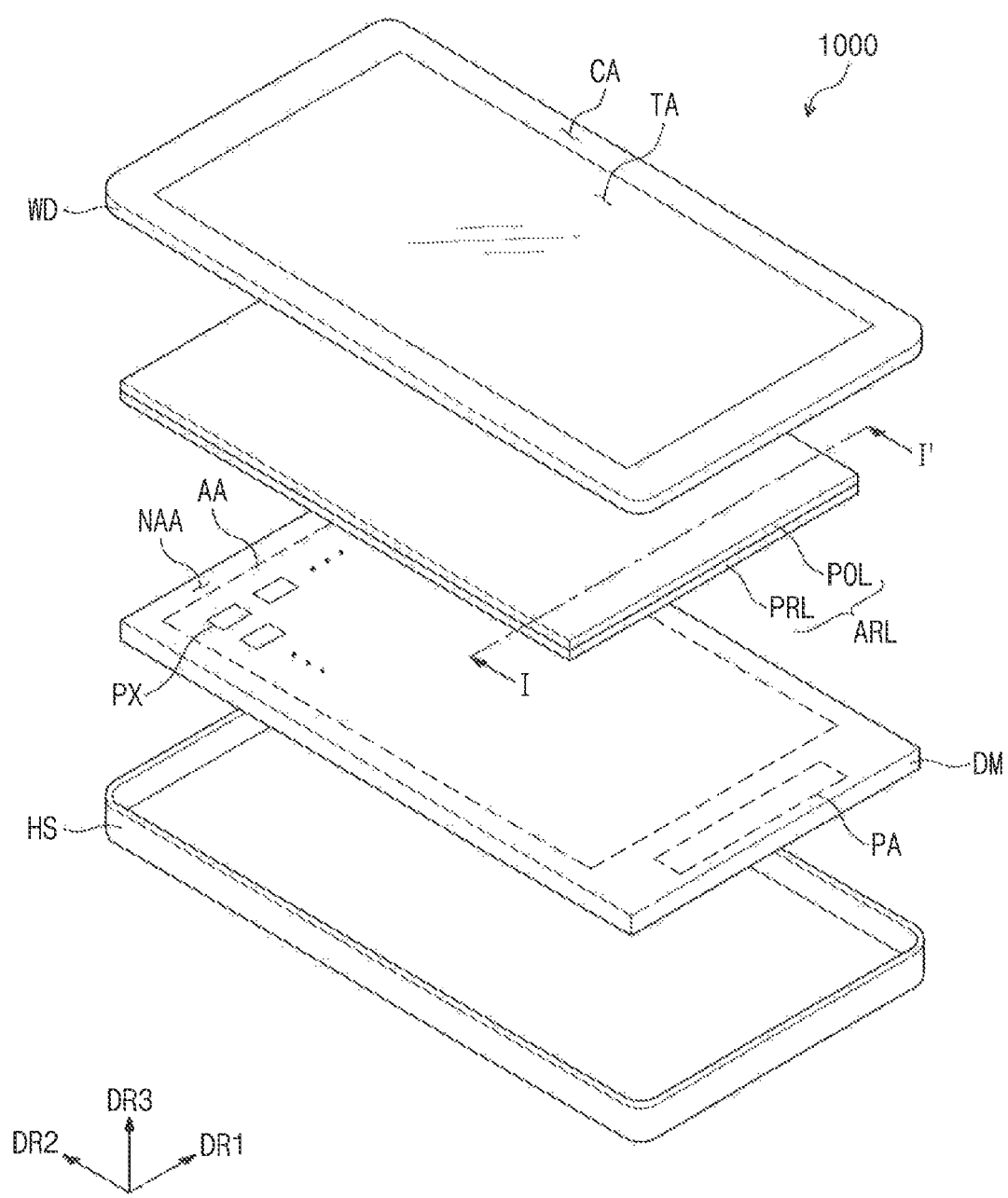
FIG. 2 is an exploded perspective view illustrating the display device of FIG. 1 according to an exemplary embodiment of the present inventive concept.
Figure 3:
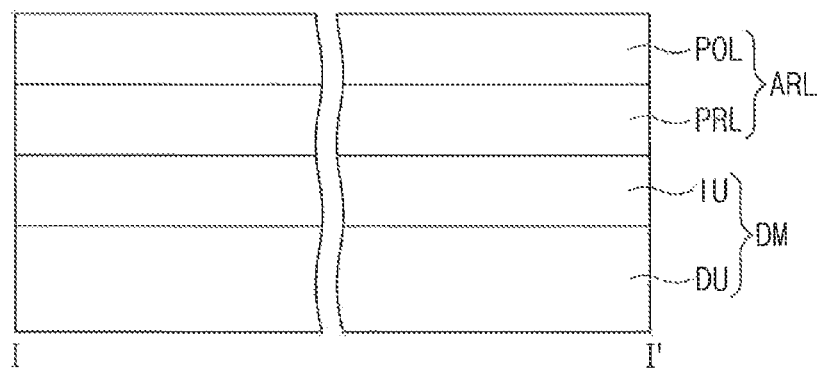
FIG. 3 is a cross-sectional view taken along a line I-I' of FIG. 2 according to an exemplary embodiment of the present inventive concept.

FIG. 1 is a perspective view illustrating a display device according to an exemplary embodiment of the present inventive concept, and FIG. 2 is an exploded perspective view illustrating the display device of FIG. 1 according to an exemplary embodiment of the present inventive concept, FIG. 3 is a cross-sectional view taken along a line I-I' of FIG. 2 according to an exemplary embodiment of the present inventive concept.

Referring to FIGS. 1 to 3, a display device 1000 according to an exemplary embodiment of the present inventive concepts may have a hexahedral shape which has a thickness in a third direction DR3 on a plane defined by a first direction DR1 and a second direction DR2 intersecting the first direction DR1. However, the present inventive concept is not limited thereto. In an exemplary embodiment of the present inventive concept, the shape of the display device 1000 may be variously modified.

According to an exemplary embodiment of the present inventive concept, the display device 1000 may include a display surface which is parallel to the first and second directions DR1 and DR2 and displays an image IM. The display surface on which the image IM is displayed may correspond to a front surface of the display device 1000.

A light transmitting area TA and a light blocking area CA may be disposed on the same side as which the image IM is displayed. For example, the light transmitting area TA and the light block area CA may be disposed in the front surface of the display device 1000. The light transmitting area TA may be an area through which the image IM is transmitted. For example, a user may view the image IM through the light transmitting area TA.

The light blocking area CA is adjacent to the light transmitting area TA. For example, the light blocking area CA may at least partially surround the light transmitting area TA. The light blocking area CA may have a predetermined color. A shape of the light transmitting area TA may correspond to the light blocking area CA. For example, the light transmitting area TA may have a rectangular shape, and the light blocking area CA may have a rectangular shape with an opening in which the light transmitting area TA is provided.

According to an exemplary embodiment of the present inventive concept, the display device 1000 may include only the light transmitting area TA.. For example, the light blocking area CA may be omitted. In this case, an image may be transmitted through a top surface (e.g., the front surface) of the display device 1000.

For the purpose of ease and convenience in description, in the display device 1000, a direction in which an image may be provided may be an upward direction, and a direction opposite to the upward direction may be a downward direction. According to an exemplary embodiment of the present inventive concept, the upward and downward directions are parallel to the third direction DR3 perpendicular to the first direction DR1 and the second direction DR2. The third direction DR3 may be a reference direction for a front surface and a rear surface of each of components to be described later.

The display device 1000 may sense an externally provided input signal. The input signal may include at least one of various kinds of inputs provided from the outside (e.g., an external device) of the display device 1000. For example, the input signal may include at least one of various external inputs such as a part (e.g., a finger) of the user's body, light, heat, and pressure. According to an exemplary embodiment of the present inventive concept, the input signal may be a touch signal. In addition, the display device 1000 may sense an input signal close or adjacent to the display device 1000 as well as the input signal coming in contact with the display device 1000.

The display device 1000 may sense the input signal applied to the light transmitting area TA but might not sense the input signal applied to the light blocking area CA. In exemplary embodiment of the present inventive concept, the display device 1000 may sense the input signal applied to the light blocking area. CA but might not sense the input signal applied to the light transmitting area. TA. In an exemplary embodiment of the present inventive concept, the display device 1000 may sense both the input signal applied to the light transmitting area TA and the input signal applied to the light blocking area CA. The display device 1000 according to an exemplary embodiment of the present inventive concept may sense the input signal applied to one or more of various areas by design of internal components. However, the present inventive concept is not limited thereto.

FIG. 1 illustrates an exemplary embodiment of the present inventive concept in which the input signal is a touch of a hand OBJ corresponding to a part of the body of the user. However, the present inventive concept is not limited thereto. The display device 1000 may sense at least one of the various kinds of the input signals, as described above.

The display device 1000 includes a window member WD, an anti-reflection member ARL, a display member DM, and a receiving member HS.

For the purpose of ease and convenience in description and illustration, FIGS. 1 and 2 may illustrate some components of the display device 1000. In addition to the illustrated members, the display device 1000 may further include various other components and circuitry such as a power supply, an optical member, a protective member, a heat dissipation member, and an electronic module including electronic elements and circuits. Descriptions and illustration of the various other components may be omitted.

The window member WD may be disposed on the front surface of the display device 1000 and may protect the anti-reflection member ARL and the display member DM. For example, the window member WD may include a glass substrate, a sapphire substrate, or a plastic film. The window member WD may have a single-layered or multi-layered structure. For example, the window member WD may have a stacked structure including a plurality of plastic films coupled to each other by an adhesive or may have a stacked structure which includes a glass substrate and a plastic film coupled to each other by an adhesive.

The display member DM is disposed under the window member WD. The display member DM may include an active area AA, a pad area PA, and a peripheral area NAA when viewed in a plan view. The display member DM includes an input sensing unit IU and a display unit DU. The input sensing unit IU is disposed on the display unit DU.

The active area AA may be an area in which the input signal is sensed. The input sensing unit IU may include a plurality of sensing electrodes disposed in the active area AA to sense the input signal. This will be described later in more detail.

The active area AA displays the image IM. The display unit DU may include a plurality of pixels PX disposed in the active area AA and may be configured to emit light to generate the image IM. The pixels PX may be arranged in a matrix form in the active area AA. Each of the pixels PX may emit light in response to an electrical signal. This will be described later in more detail.

The pad area PA may be disposed adjacent to one side of the active area AA. A plurality of pads may be disposed in the pad area PA. The pad area PA may be an area connected to a circuit board. The display member DM may be electrically connected to an external element or component through the pad area PA.

According to an exemplary embodiment of the present inventive concept, a single pad area PA is illustrated for the purpose of ease and convenience in description and illustration. In addition, in an exemplary embodiment of the present inventive concept, the display member DM may include a plurality of pad areas. In an exemplary embodiment of the present inventive concept, the display member DM may he designed such that different electrical signals may be applied to the single pad area PA. In an exemplary embodiment of the present inventive concept, the display member DM may be designed such that different electrical signals may be applied to the plurality of pad areas, respectively.

In addition, the plurality of pad areas may be formed on different layers from each other or may be formed on the same layer. The display member DM may have at least one of various types of pad areas PA, and the present inventive concept is not limited to a specific embodiment. The pad area PA which receives the input signal sensed in the active area AA and/or transmits a signal to the active area AA will he described hereinafter as an example.

The peripheral area NAA is adjacent to the active area AA and the pad area PA. According to an exemplary embodiment of the present inventive concept, the peripheral area NAA may surround each of the active area AA and the pad area PA. However, the present inventive concept is not limited thereto. For example, the peripheral area NAA may partially surround the active area AA and the pad area PA.

The display member DM will be described later in more detail with reference to FIGS. 5 to 8.

The anti-reflection member ARL is disposed between the window member WD and the display member DM. The anti-reflection member ARL overlaps with the active area AA of the display member DM when viewed in a plan view. According to an exemplary embodiment of the present inventive concept, an area (or size) of the anti-reflection member ARL may be less than an area (or size) of the display member DM when viewed in a plan view.

The anti-reflection member ARL may prevent external light incident to the display device 1000 from being reflected by the display member DM to be provided to a user. The anti-reflection member ARL may include a polarizing layer POL and a phase retardation layer PRL.

The polarizing layer POL is disposed under the window member WD. Even though not shown in the drawings, the polarizing layer POL has a transmission axis and an absorption axis intersecting the transmission axis. In an exemplary embodiment of the present inventive concept, the transmission axis and the absorption axis may be substantially perpendicular to each other. Accordingly, one of components of external light incident on the polarizing layer POL may be absorbed or reflected by the absorption axis, and thus, the external light might not pass through the polarizing layer POL. In addition, another component, perpendicular to the one component, of the components of the external light incident on the polarizing layer POL may pass through the polarizing layer POL. For example, the polarizing layer POL may linearly polarize the external light.

The polarizing layer POL may be formed of a polymer resin elongated in a predetermined direction. However, the present inventive concept is not limited thereto. In an exemplary embodiment of the present inventive concept, the polarizing layer POL may be a wire grid polarizer.

Even though not shown in the drawings, in an exemplary embodiment of the present inventive concept, the anti-reflection member ARL may further include supporters disposed on and under the polarizing layer POL. The supporters may support the polarizing layer POL and may prevent external contamination from environmental elements (e.g., moisture) and external impact.

The phase retardation layer PRL is disposed under the polarizing layer POL. For example, the phase retardation layer PRL has optical anisotropy. Thus, the phase retardation layer PRL may retard a phase of a component of light incident thereto. For example, the phase retardation layer PRL may change a polarization state of the light. For example, the phase retardation layer PRL may retard the phase of the component of the incident light by $\lambda/4$. For example, the phase retardation layer PRL may be a quarter-wave film. As a result, the phase retardation layer PRL may retard the phase of the component of the light passing therethrough, and thus, the polarization state of the light may be changed from a linear polarization state into a circular polarization state or from the circular polarization state into the linear polarization state.

The phase retardation layer PRL may include at least one of; for example, a polycarbonate (PC)-based resin, a cyclo-olefin polymer (COP)-based resin, an acrylic-based resin, or a cellulose-based resin. However, the present inventive concept is not limited to the materials of the phase retardation layer PRL. In an exemplary embodiment of the present inventive concept, the phase retardation layer PRL may include liquid crystals.

As a result, the external light may be linearly polarized through the polarizing layer POL, and the linearly polarized light may be circularly polarized through the phase retardation layer PRL. The circularly polarized light may be reflected by the display member DM. A polarization state of the circularly polarized light may be changed. For example, when the external light in a left-circular polarization state is incident on the display member DM, the external light may be reflected by the display member DM, and thus, the left-circular polarization state of the external light may be changed into a right-circular polarization state. In addition, when the external light in the right-circular polarization state is incident on the display member DM, the external light may be reflected by the display member DM, and thus, the right-circular polarization state of the external light may be changed into the left-circular polarization state.

The reflected light with the changed polarization state may be incident on the phase retardation layer PRL again, and a phase of the reflected light may be retarded through the phase retardation layer PRL. Thus, the circular polarization state of the reflected light may be changed into a linear polarization state. At this time, a linear polarization direction of the reflected light may be parallel to the absorption axis of the polarizing layer POL. Thus, the reflected light which is linearly polarized may be absorbed by the polarizing layer POL.

The receiving member HS is disposed on a rear surface of the display member DM. The receiving member HS is coupled to the window member WD and provides a rear surface for the display device 1000. The receiving member HS is coupled to the window member WD to provide an inner space. The anti-reflection member ARL, the display member DM and various electronic and/or optical components and circuits are received in the inner space.

The receiving member HS may be formed of a material having relatively high rigidity. For example, the receiving member HS may include a plurality of frames and/or plates, which are formed of glass, plastic, and/or a metal. The receiving member HS may stably protect the components of the display device 1000, which are received in the inner space.

Figure 4:
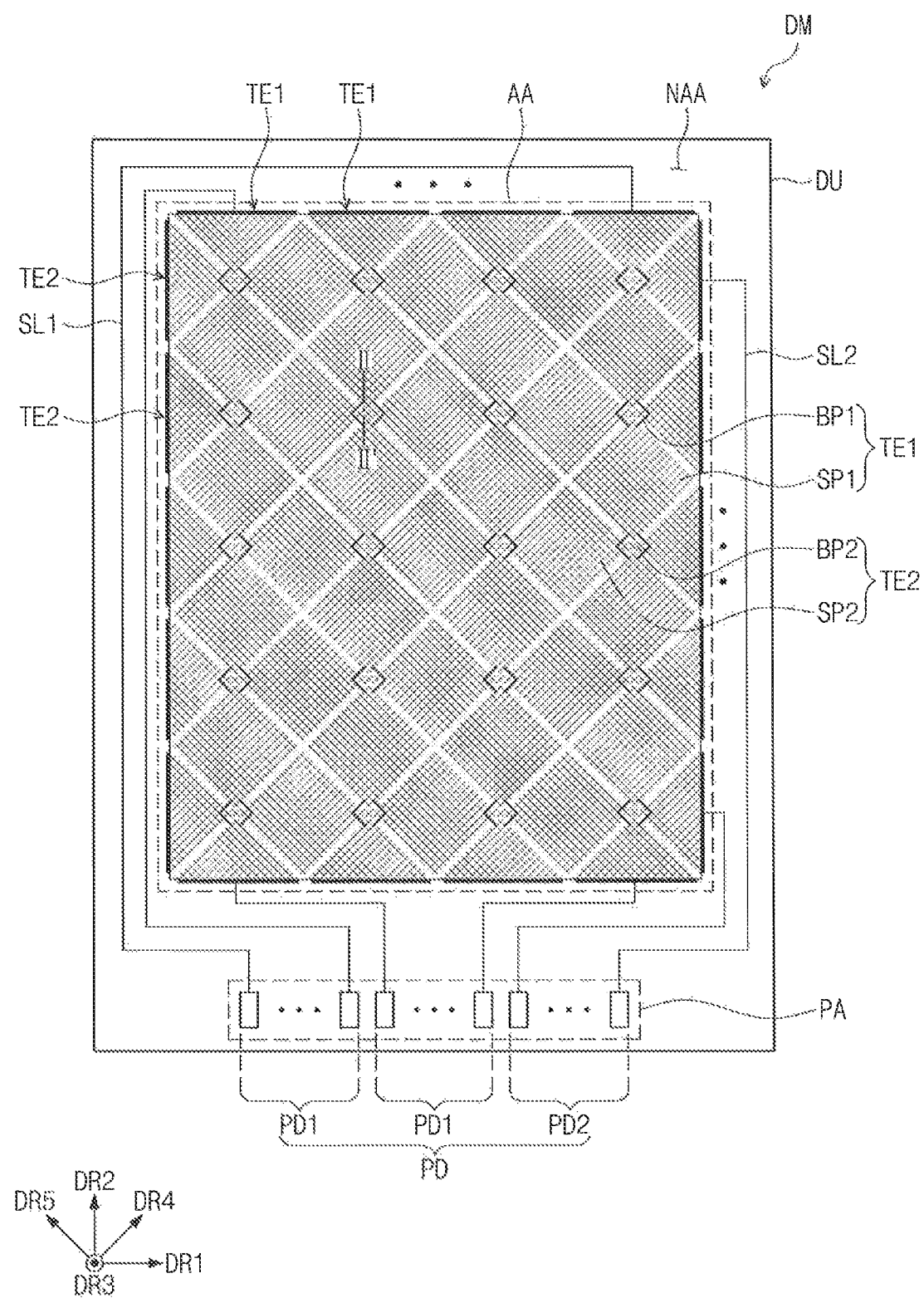
FIG. 4 is a plan view illustrating a display member of FIG, 2 according to an exemplary embodiment of the present inventive concept.
Figure 5:
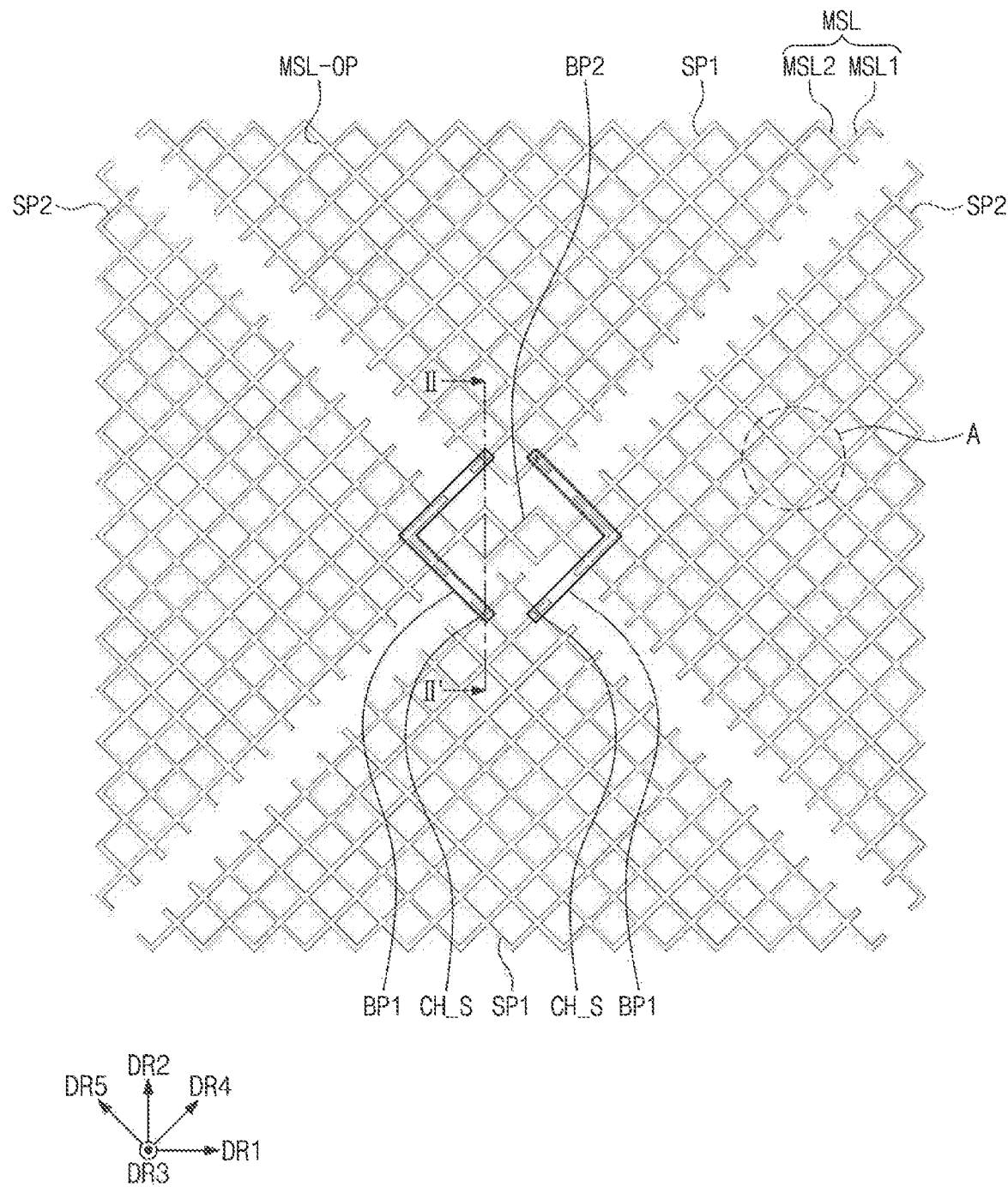
FIG. 5 is an enlarged view of a portion of FIG. 4 according to an exemplary embodiment of the present inventive concept.
Figure 6:
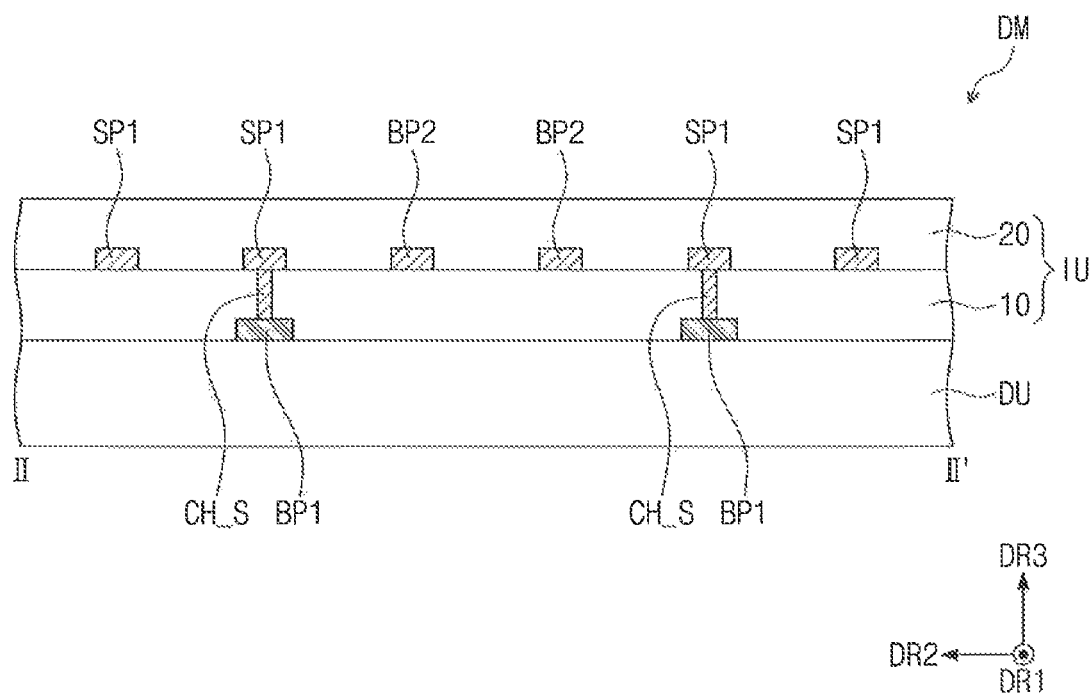
FIG. 6 is a cross-sectional view taken along a line II-II' of FIG. 5 according to an exemplary embodiment of the present inventive concept.

FIG. 4 is a plan view illustrating a display member of FIG. 2 according to an exemplary embodiment of the present inventive concept, and FIG. 5 is an enlarged view of a portion of FIG. 4 according to an exemplary embodiment of the present inventive concept, FIG. 6 is a cross-sectional view taken along a line II-II' of FIG. 5 according to an exemplary embodiment of the present inventive concept.

Referring to FIGS. 4 to 6, the input sensing unit IU is disposed on the display unit DU. The input sensing unit IU may include a first sensing electrode TE1, a second sensing electrode TE2, a first signal line SL1, a second signal line SL2, and a pad PD. The first sensing electrode TE1, the second sensing electrode TE2, the first signal line SL1, the second signal line SL2 and the pad PD may include conductive patterns.

The first sensing electrode TE1 extends in the second direction DR2. The first sensing electrode TE1 may be provided in plural, and the plurality of first sensing electrodes TE1 may be arranged in the first direction DR1.

The second sensing electrode TE2 may be insulated from the first sensing electrode TE1. The second sensing electrode TE2 extends in the first direction DR1. The second sensing electrode TE2 may be provided in plural, and the plurality of second sensing electrodes TE2 may be arranged in the second direction DR2.

The input sensing unit IU may sense an external input signal by sensing a change in mutual capacitance between the first sensing electrode TE1 and the second sensing electrode TE2 or may sense the external input signal by sensing a change in self-capacitance of each of the first and second sensing electrodes TE1 and TE2. However, the present inventive concept is not limited thereto. In an exemplary embodiment of the present inventive concept, the input sensing unit IU may sense the external input signal by using at least one of other various methods. For example, the input sensing unit IU may use a surface capacitance method.

The first signal line SL1 is connected to the first sensing electrode TE1. The first signal line SL1 may be disposed in the peripheral area NAA and thus might not be visible to the outside. The second signal line SL2 is connected to the second sensing electrode TE2. The second signal line SL2 may be disposed in the peripheral area NAA and thus might not be visible to the outside.

In addition, in an exemplary embodiment of the present inventive concept, one first sensing electrode TE1 may be connected to two first signal lines SL1. A first end of the first sensing electrode TE1 may be connected to a first-first signal line SL1 of the two first signal lines SL1, and a second end of the first sensing electrode TE1 may be connected to a second-first signal SL1 of the two first signal lines SL1. In addition, the first-first signal line SL1 may be connected to a first-first pad PD1, and the second-first signal line SL1 may be connected to a second-first pad PD1. Thus, even though the first sensing electrode TE1 is longer than the second sensing electrode TE2, an electrical signal may be substantially uniformly applied to an entire area. As a result, a substantially uniform touch sensing environment may be provided to the entire active area AA regardless of the shape of the input sensing unit IU. However, the present inventive concept is not limited thereto. The input sensing unit IU may be driven by various methods, and the present inventive concept is not limited to a specific embodiment.

The pads PD may include the first pad PD1 and a second pad PD2. Each of the pads PD may be connected to the first signal line SL1 or the second signal line SL2 and may be electrically connected to the first sensing electrode TE1 or the second sensing electrode TE2 through the first signal line SL1 or the second signal line SL2.

According to an exemplary embodiment of the present inventive concept, the first sensing electrode TE1 includes a plurality of first sensor patterns SP1 and a plurality of first connection patterns BP1. The first sensor patterns SP1 may be arranged in the second direction DR2 and may be spaced apart from each other. Each of the first connection patterns BP1 may be disposed between each of the first sensor patterns SP1 adjacent to each other to connect the first sensor patterns SP1 to each other.

The second sensing electrode TE2 includes a plurality of second sensor patterns SP2 and a plurality of second connection patterns BP2. The second sensor patterns SP2 may be arranged in the first direction DR1 and may be spaced apart from each other. Each of the second connection patterns BP2 may be disposed between each of the second sensor patterns SP2 adjacent to each other to connect the second sensor patterns SP2 to each other. In an exemplary embodiment of the present inventive concept, the second sensor patterns SP2 and the second connection patterns BP2 may be formed as a single unitary body.

According to an exemplary embodiment of the present inventive concept, the first sensor patterns SP1 may be disposed on the same layer as the second sensor patterns SP2 and the second connection patterns BP2, and the first connection patterns BP1 may be disposed on a layer different from the layer on which the first sensor patterns SP1 are disposed.

For example, the input sensing unit IU may include a plurality of insulating layers stacked on each other when viewed in a cross-sectional view. The first connection patterns BP1 are disposed on the display unit DU. The first connection patterns BP1 may be a first conductive layer. A first insulating layer 10 is disposed on the first conductive layer BP1 and, for example, covers the first conductive layer BP1 and the display unit DU. The first sensor patterns SP1 of the first sensing electrode TE1 and the second sensor patterns SP2 and the second connection patterns BP2 of the second sensing electrode TE2 are disposed on the first insulating layer 10. The patterns SP1, SP2 and BP2 disposed on the first insulating layer 10 may be a second conductive layer. A second insulating layer 20 is disposed on the second conductive layer SP1, SP2 and BP2. For example, the second insulating layer 20 covers the second conductive layer SP1, SP2 and EP2 and the first insulating layer 10. The first sensor patterns SP1 may be connected to the first connection patterns BP1 through connection contact holes CH_S penetrating the first insulating layer 10.

Each of the patterns (e.g., the first sensor patterns SP1, the second sensor patterns SP2 and the second connection patterns BP2) of the second conductive layer may include a plurality of mesh lines MSL. The mesh lines MSL may include first mesh lines MSL1 extending in a fourth direction DR4 and second mesh lines MSL2 extending in a fifth direction DRS to intersect the first mesh lines MSL1. An opening MSL-OP may be formed from the first mesh lines MSL1 and the second mesh lines MSL2 intersecting each other.

Figure 7:
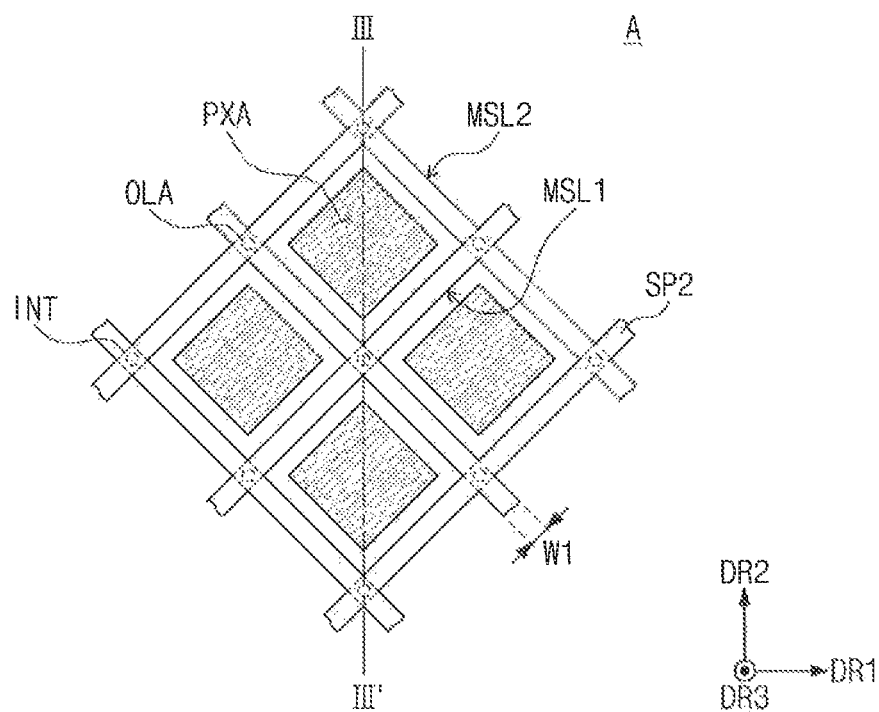
FIG. 7 is an enlarged view of an area 'A' of FIG. 5 according to an exemplary embodiment of the present inventive concept.
Figure 8:
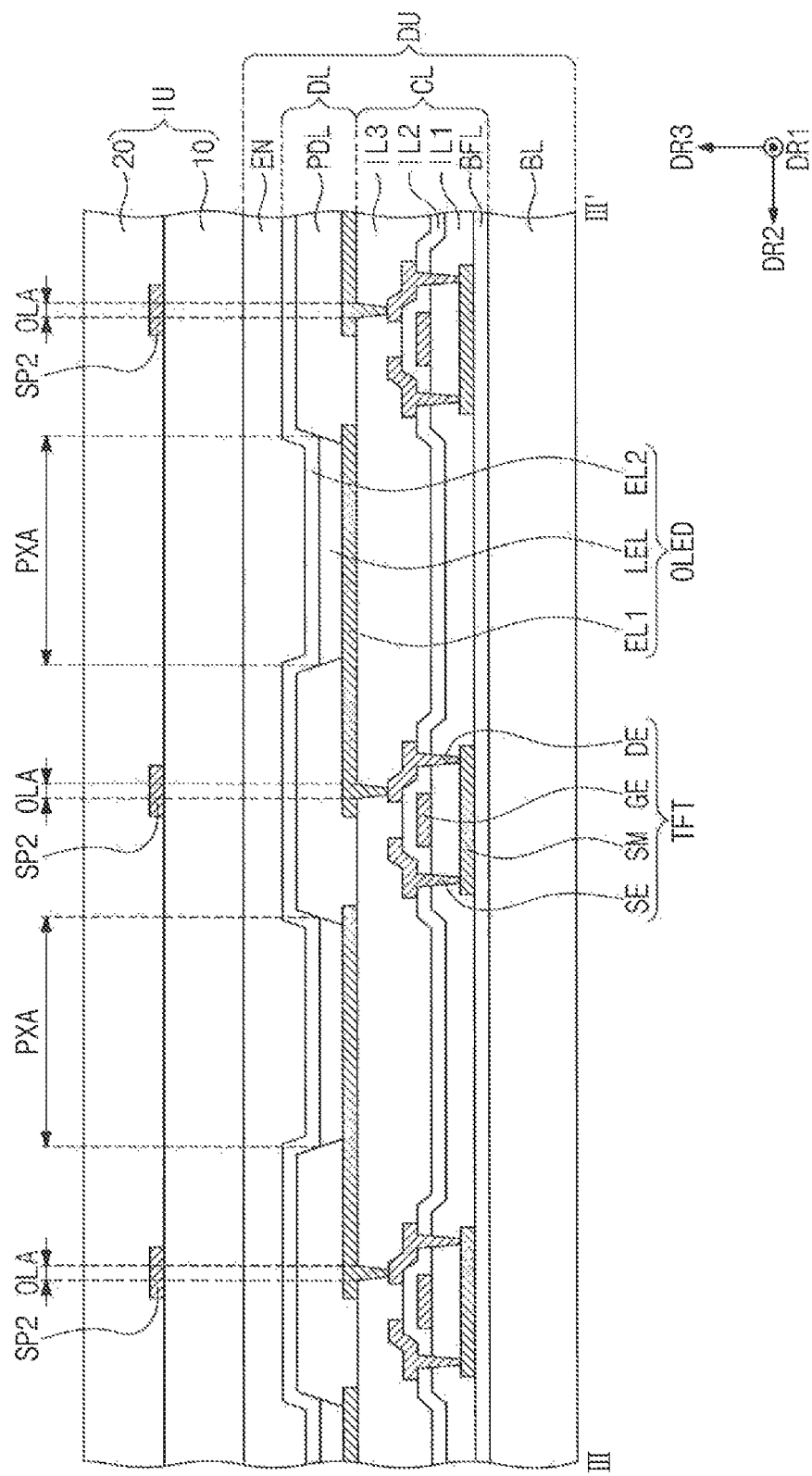
FIG. 8 is a cross-sectional view taken along a line III-III' of FIG. 7 according to an exemplary embodiment of the present inventive concept.

FIG. 7 is an enlarged view of an area 'A' of FIG. 5 according to an exemplary embodiment of the present inventive concept, and FIG. 8 is a cross-sectional view taken along a line III-III' of FIG. 7 according to an exemplary embodiment of the present inventive concept.

According to an exemplary embodiment of the present inventive concept, the display unit DU includes a base layer BL, a circuit layer CL, a display layer DL, and an encapsulation layer EN. The circuit layer CL and the display layer DL are sequentially stacked on the base layer BL. The base layer BL may be a substrate formed of an insulating material such as glass or plastic. For example, the base layer EL may include a synthetic resin film. However, the present inventive concept is not limited thereto. In an exemplary embodiment of the present inventive concept, the base layer BL may be formed of various other materials.

The circuit layer CL includes a functional layer BFL, a transistor TFT and first to third intermediate insulating layers IL1 to IL3.

The functional layer BFL may be disposed on the base layer BL. For example, the functional layer BFL may be a buffer layer. However, the present inventive concept is not limited thereto. In an exemplary embodiment of the present inventive concept, the functional layer BFL may be a barrier layer. The buffer layer may increase bonding force between the base layer BL and a layer disposed on the base layer BL, and the barrier layer may prevent a foreign material from being provided into a layer disposed on the base layer BL. For example, a layer disposed between the barrier layer and the base layer BL.

The transistor TFT may be a thin film transistor. The transistor TFT may include a semiconductor layer SM, a control electrode GE, an input electrode SE, and an output electrode DE. The semiconductor layer SM is formed of a semiconductor material and acts as an active layer of the transistor TFT. For example, the semiconductor layer SM may be formed of an inorganic semiconductor or an organic semiconductor.

The first intermediate insulating layer IL1 is provided on the semiconductor layer SM. The first intermediate insulating layer IL1 covers the semiconductor layer SM. For example, the first intermediate insulating layer IL1 may include an organic insulating material and/or an inorganic insulating material.

The control electrode GE and the second intermediate insulating layer IL2 are sequentially provided on the first intermediate insulating layer IL1. For example, the control electrode GE is disposed on the first intermediate insulating layer IL1, and the second intermediate insulating layer IL2 covers the gate electrode GE and the first intermediate insulating layer IL1. The control electrode GE may be formed to cover an area corresponding to a channel region of the semiconductor layer SM. The input electrode SE and the output electrode DE are disposed on the second intermediate insulating layer IL2. The input electrode SE and the output electrode DE may be connected to the semiconductor layer SM through control contact holes formed in the first and second intermediate insulating layers IL1 and IL2.

The third intermediate insulating layer IL3 is disposed on the input electrode SE, the output electrode DE, and the second intermediate insulating layer IL2. The third intermediate insulating layer IL3 may act as a protective layer protecting the transistor TFT and/or may act as a planarization layer having a planarized top surface.

The display layer DL includes an organic light emitting element OLED. The organic light emitting element OLED is disposed on the third intermediate insulating layer IL3 of the circuit layer CL. The organic light emitting element OLED includes a first electrode EL1, a second electrode EL2 disposed on the first electrode EL1, and a light emitting layer LEL disposed between the first electrode EL1 and the second electrode EL2. The organic light emitting element OLED and the transistor (e.g., the thin film transistor) TFT may be included in each of the pixels PX (see, e.g., FIG. 2).

The first electrode EL 1may be a pixel electrode or an anode. The first electrode EL1 may be a semitransparent or reflective electrode. For example, the first electrode EL1 may include Ag, Mg, Al, Pt, Pd, Au, Ni, Nd, ir, Cr, or any combination thereof. In addition, the first electrode EL1 may have a multi-layered structure that includes a reflective or semitransparent layer formed of the aforementioned material and a transparent conductive layer formed of, for example, indium tin oxide (ITO), indium zinc oxide (IZO), zinc oxide (ZnO), or indium tin zinc oxide (ITZO).

The second electrode EL2 may be a common electrode or a cathode. The second electrode EL2 may be a transparent electrode. For example, the second electrode EL2 may include Li, Ca, LiF/Ca, LiF/Al, Al, Mg, BaF, Ba, Ag, any compound thereof, or any mixture thereof (e.g., a mixture of Ag and Mg). However, the present inventive concept is not limited thereto. In an exemplary embodiment of the present inventive concept, the second electrode EL may include indium tin oxide (ITO), indium zinc oxide (IZO), zinc oxide (ZnO), or indium tin zinc oxide (ITZO).

A pixel defining layer PDL may he disposed on the first electrode EL1. For example, the pixel defining layer PDL may cover a portion of the first electrode EL1 and may expose another portion of the first electrode EL1. For example, the pixel defining layer PDL may include an opening exposing a portion of the first electrode EL1. The pixel defining layer PDL may include, but is not limited to, a metal-fluorine ion compound. For example, the pixel defining layer PDL may include the metal-fluorine ion compound such as LiF, $BaF_2$, and/or CsF. The metal-fluorine ion compound may have insulating characteristics when it has a predetermined thickness. The pixel defining layer PDL may provide a light emitting area PXA. For example, the opening in the pixel defining layer PDL may provide a light emitting area PXA.

The light emitting layer LEL may be disposed between the first electrode EL1 and the second electrode EL2. For example, the light emitting layer LEL may be disposed in the light emitting area PXA provided in the pixel defining layer PDL. For example, the light emitting layer LEL may be disposed in the opening of the pixel defining layer PDL.

A plurality of common layers may be disposed between the first electrode EL1 and the second electrode EL2. For example, a hole injection layer, a hole transfer layer, the light emitting layer LEL, an electron transfer layer and an electron injection layer may be sequentially stacked between the first electrode. EL1 and the second electrode EL2. In addition, at least one of a hole stop layer, a hole buffer layer or an electron stop layer may be disposed between the first electrode EL1 and the second electrode EL2.

The encapsulation layer EN is disposed on the display layer DL. The encapsulation layer EN covers the display layer DL. The encapsulation layer EN may protect the display layer DL from water or another external contaminant. The encapsulation layer EN may include at least one inorganic layer and at least one organic layer.

According to an exemplary embodiment of the present inventive concept, the light emitting layers LEL of the organic light emitting elements OLED may be exposed through the openings MSL-OP (see, e.g., FIG. 5) provided by the plurality of mesh lines MSL. For example, the mesh lines MSL may be disposed between the light emitting areas PXA when viewed in a plan view. As a result, since the light emitting areas PXA are not covered by the first and second sensing electrodes TE1 and TE2 composed of the mesh lines MSL, display quality of the display device 1000 may be increased.

In addition, according to an exemplary embodiment of the present inventive concept, a contact hole through which the output electrode DE of the transistor TFT is connected to the first electrode EL1 of the organic light emitting element OLED may overlap with at least one of the mesh lines MSL. For example, at least one MSL1 and/or MSL2 of the mesh lines MSL may cover the contact hole in the display unit DU.

For example, areas where the first mesh lines MSL1 intersect the second mesh lines MSL2 may be intersection areas INT, and the contact hole connecting the first electrode EL1 and the output electrode DE may be disposed to overlap with the intersection area INT.

According to an exemplary embodiment of the present inventive concept, an area (or size) of the intersection area INT may be equal to or greater than an area (or size) OLA of the contact hole. In addition, a width W1 of each of the mesh lines MSL1 and MSL2 in the intersection area INT may be equal to or greater than a width of the contact hole connecting the first electrode EU and the output electrode DE. In an exemplary embodiment of the present inventive concept, the contact hole connecting the first electrode EL1 and the output electrode DE may penetrate the third intermediate insulating layer IL3, as illustrated in FIG. 8.

According to an exemplary embodiment of the present inventive concept, a reflectance of the mesh lines MSL1 and MSL2 included in the sensing electrodes TE1 and TE2 may be equal to or less than a reflectance of the first electrode EL1. For example, each of the mesh lines MSL1 and MSL2 included in the sensing electrodes TE1 and TE2 may include at least one of copper, titanium, or aluminum or may include a mixture thereof.

In a comparative example, if the contact hole, connecting the first electrode EL1 and the output electrode DE, does not overlap with the sensing electrodes TE1 and 1E2, unlike the present embodiment, circularly polarized light incident to the display member DM may be reflected a plurality of times by the contact hole. In this case, a polarization direction of light reflected an even number of times, of the lights reflected the plurality of times, may be different from a polarization direction of light reflected an odd number of times by the first electrode EL1. For example, since the polarization direction of the light reflected the even number of times is different from the polarization direction of the light reflected the odd number of times, the light reflected the even number of times might not be absorbed by the anti-reflection member ARL. Thus, the reflected light of the external light may be provided to a user. However, according an exemplary embodiment of the present inventive concept, since the sensing electrodes TE1 and TE2 are disposed to overlap with the contact holes, the external light incident to the display device 1000 might not be reflected a plurality of times. For example, the amount of light absorbed by the anti-reflection member ARL may increase. Thus, a user might not be able to observe the external light reflected from the display device 1000.

In an exemplary embodiment of the present inventive concept, the sensing electrodes TE1 and TE2 overlap with the contact holes in which the first electrodes EL1 are formed. However, the present inventive concept is not limited thereto. In an exemplary embodiment of the present inventive concept, the display unit DU may include the contact holes and may include a conductive pattern which includes a reflective material and a bent portion when viewed in a cross-sectional view. In this case, the conductive pattern having the bent portion may affect the reflection of the external light. In an exemplary embodiment of the present inventive concept, the sensing electrode TE1 and/or TE2 may overlap with the conductive pattern having the bent portion when viewed in a plan view.

Figure 9:
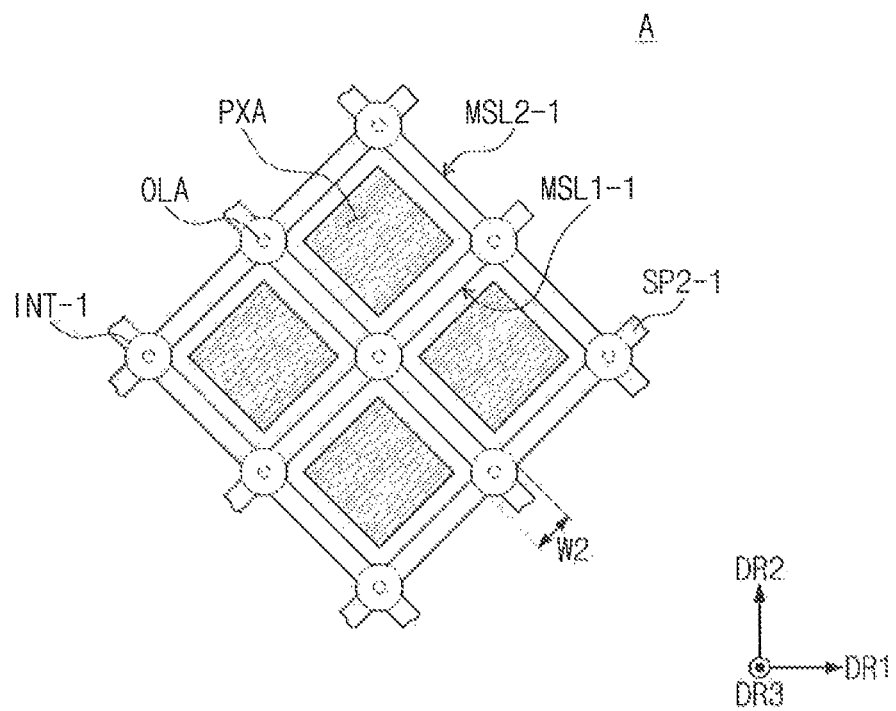
FIG. 9 is an enlarged view of the area 'A' of FIG. 5 to illustrate a display device according to an exemplary embodiment of the present inventive concept.

FIG. 9 is an enlarged view of the area 'A' of FIG. 5 to illustrate a display device according to an exemplary embodiment of the present inventive concept.

For the purpose of ease and convenience in description, differences between the present embodiment and the above embodiment may be mainly described and the same descriptions as in the above embodiment may be omitted. In addition, the same components and/or elements as described above may be indicated by the same reference numerals or the same reference designators, and the descriptions thereto may be omitted.

In an exemplary embodiment of the present inventive concept, illustrated in FIG. 7, the mesh lines MSL1 and MSL2 have substantially uniform widths. However, the present inventive concept is not limited thereto.

According to the present embodiment illustrated in. FIG. 9, each of first and second mesh lines MSL1-1 and MSL2-1 may have an increased width in an intersection area INT-1. For example, a width W2 of each of the mesh lines MSL1-1 and MSL2-1 in the intersection area INT-1 may be greater than a width of another portion of each of the mesh lines MSL1-1 and MSL2-1 outside the intersection area. INT-1. For example, the portions of the mesh lines MSL1-1 and MSL2-1 that do not intersect one another may have a width smaller than the width W2 of each of the mesh lines MSL1-1 and MSL2-1 in the intersection area INT-1. In this case, even though a distance between the light emitting areas PPA is small (e.g., the width of the other portion of each of the mesh lines MSL1-1 and MSL2-1 outside of the intersection area INT-1 is small), the mesh lines MSL1-1 and MSL2-1 may overlap with the contact hole of the first electrode EL1 in the intersection area INT-1. Thus, the reflection of the external light may be prevented.

Figure 10:
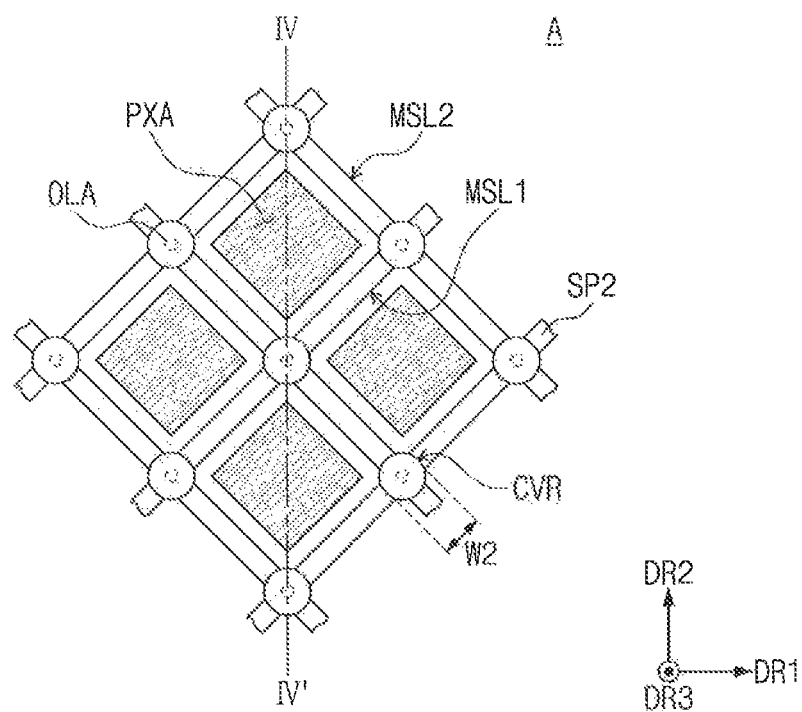
FIG. 10 is an enlarged view of the area 'A' of FIG, 5 to illustrate a display device according to an exemplary embodiment of the present inventive concept.
Figure 11:
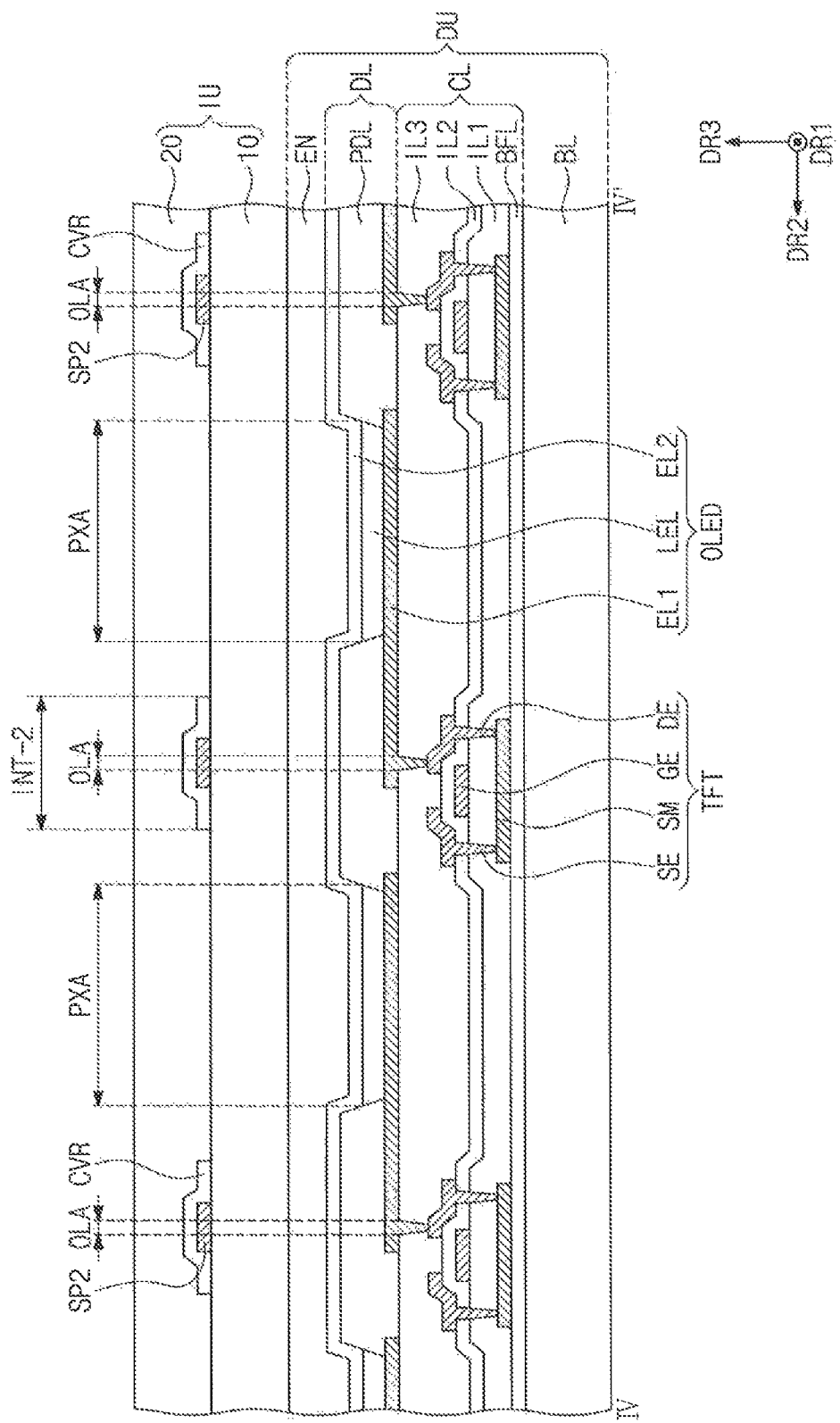
FIG. 11 is a cross-sectional view taken along a line IV-IV' of FIG. 10 according to an exemplary embodiment of the present inventive concept.

FIG. 10 is an enlarged view of the area 'A' of FIG. 5 to illustrate a display device according to an exemplary embodiment of the present inventive concept, and FIG. 11 is a cross-sectional view taken along a line IV-IV' of FIG. 10 according to an exemplary embodiment of the present inventive concept.

For the purpose of ease and convenience in description, differences between the present embodiment and the above embodiments may be mainly described and the same descriptions as in the above embodiments may be omitted. In addition, the same components and/or elements as described above may be indicated by the same reference numerals or the same reference designators, and the descriptions thereto may be omitted.

Referring to FIGS. 10 and 11, each of sensing electrodes TE1 and TE2 according an exemplary embodiment of the present inventive concept includes a plurality of cover electrodes CVR disposed on intersection areas INT-2, respectively. The cover electrodes CVR are disposed on the intersection areas INT-2 to overlap with the contact holes of the first electrodes EL1 when viewed in a plan view.

According to an exemplary embodiment of the present inventive concept, an area of each of the cover electrodes CVR may be equal to or greater than the area OLA of the contact hole of the first electrode EL1. In addition, the cover electrode CVR may cover the mesh lines MSL1 and MSL2 in the intersection area.

According to an exemplary embodiment of the present inventive concept, each of the cover electrodes CVR has a circular shape when viewed in a plan view. However, the present inventive concept is not limited thereto. In an exemplary embodiment of the present inventive concept, each of the cover electrodes CVR may have one of other various shapes, such as a quadrilateral shape.

In FIG. 11, the cover electrodes CVR have a single-layered structure. However, the present inventive concept is not limited thereto. In an exemplary embodiment of the present inventive concept, the cover electrodes CVR may have a multi-layered structure.

In FIG. 11, a top surface of each of the cover electrodes CVR is not flat. However, the present inventive concept is not limited thereto. In an exemplary embodiment of the present inventive concept, the top surfaces of the cover electrodes CVR may be substantially flat to increase the anti-reflection effect of the external light.

In FIG. 11, the cover electrodes CVR are disposed on the mesh lines MSL1 and MSL2. However, the present inventive concept is not limited thereto, in an exemplary embodiment of the present inventive concept, the cover electrodes CVR may be disposed under the mesh lines MSL1 and MSL2 or may be disposed on a layer different from a layer on which the mesh lines MSL1 and MSL2 are disposed.

In an exemplary embodiment of the present inventive concept, the cover electrodes CVR may cover the intersection area INT-2 and portions of the first mesh line MSL1 and the second mesh line MSL2 that do not intersect one another.

As a result, according to an exemplary embodiment of the present inventive concept, the reflection of external light may be prevented. For example, the display quality of the display device 1000 may be increased.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display device comprising:
a display unit including a plurality of light emitting areas, a plurality of thin film transistors, and a plurality of organic light emitting elements;
an input sensing, unit including, a plurality of sensing electrodes and disposed on the display unit, wherein the plurality of sensing electrodes includes a plurality of openings; and
an anti-reflection member disposed on the input sensing unit,
wherein each of the plurality of organic light emitting elements comprises:
a first electrode disposed above a first thin film transistor of the plurality of thin film transistors and connected to the first thin film transistor through a contact hole;
a light emitting layer disposed on the first electrode and overlapping a first light emitting area of the plurality of light emitting areas; and
a second electrode covering the light emitting layer,
wherein each of the light emitting areas is exposed by a corresponding opening of the plurality of openings of the plurality of sensing electrodes, and
wherein the plurality of sensing electrodes overlaps with the contact holes.

2. The display device of claim 1, wherein a reflectance of the plurality of sensing electrodes is less than a reflectance of the first electrode.

3. The display device of claim 2, wherein each of the plurality of sensing electrodes includes copper, titanium, and/or aluminum.

4. The display device of claim 1, wherein the plurality of sensing electrodes comprises:
first sensing electrodes arranged in a first direction; and
second sensing electrodes insulated from the first sensing electrodes and arranged in a second direction intersecting the first direction.

5. The display device of claim 4, wherein each of the first sensing electrodes comprises:
a plurality of first sensor patterns arranged in the second direction; and
first connection patterns, wherein each of the first connection patterns is disposed between the first sensor patterns adjacent to each other and connects the first sensor patterns to each other, and
wherein each of the second sensing electrodes comprises:
a plurality of second sensor patterns arranged in the first direction; and
second connection patterns, wherein each of the second connection patterns is disposed between the second sensor patterns adjacent to each other and connects the second sensor patterns to each other.

6. The display device of claim 5, wherein each of the first and second sensor patterns comprises:
a plurality of first mesh lines; and
a plurality of second mesh lines intersecting the first mesh lines, and
wherein the openings are formed by the first and second mesh lines.

7. The display device of claim 6, wherein a width of each of the first and second mesh lines is equal to or greater than a width of the contact hole.

8. The display device of claim 6, wherein each area where a first mesh line of the plurality of first mesh lines intersects a second mesh line of the plurality of second mesh lines is an intersection area, and
wherein the intersection area overlaps with the contact hole.

9. The display device of claim 8, wherein an area of the intersection area is equal to or greater than an area of the contact hole.

10. The display device of claim 8, wherein a width of a first portion of each of the first and second mesh lines in the intersection area is greater than a width of a second portion of each of the first and second mesh lines adjacent to the intersection area.

11. The display device of claim 8, wherein each of the first and second sensing electrodes further comprises: a plurality of cover electrodes, wherein each cover electrode is disposed on each intersection area and covers each intersection area.

12. The display device of claim 11, wherein each of the cover electrodes has a circular shape.

13. The display device of claim 5, wherein the first sensor patterns and the second sensor patterns are disposed on the same layer.

14. The display device of claim 13, wherein the first connection patterns are disposed on a layer different from a layer on which the first sensor patterns are disposed, and
wherein each of the first connection patterns is connected to the first sensor patterns through connection contact holes.

15. The display device of claim 1, wherein the anti-reflection member comprises:

a phase retardation layer retarding a phase of a component of incident light; and a polarizing layer disposed on the phase retardation layer and absorbing a component of incident light.

16. A display device comprising:
a display unit configured to display an image and including a plurality of light emitting areas;
a plurality of sensing electrodes disposed on the display unit, wherein each of the plurality of sensing electrodes comprises a plurality of mesh lines; and
an anti-reflection member disposed on the plurality of sensing electrodes and absorbs light reflected by the display unit,
wherein the display unit comprises:
a plurality of thin film transistors;
a first electrode connected to each of the plurality of thin film transistors through a contact hole;
a second electrode disposed on the first electrode; and
a light emitting layer disposed between the first electrode and the second electrode and overlapping a light emitting area of the plurality of light emitting areas,
wherein each of the plurality of mesh lines is disposed between the light emitting areas, and
wherein the contact hole is covered by the mesh lines.

17. The display device of claim 16, wherein the mesh lines comprise:
a plurality of first mesh lines extending in a first direction; and
a plurality of second mesh lines extending in a second direction intersecting the first mesh lines and the first direction, wherein areas where a first mesh line of the plurality of first mesh lines intersects a second mesh line of the plurality of second mesh lines are intersection areas,
wherein one of the intersection areas overlaps with the contact hole.

18. The display device of claim 17, wherein each of the plurality of sensing electrodes further comprises:
a plurality of cover electrodes disposed on the first mesh lines and the second mesh lines and covering the intersection areas.

19. The display device of claim 17, wherein a width of a first portion of each of the first and second mesh lines in each intersection area is greater than a width of a second portion of each of the first and second mesh lines adjacent to the intersection area.

20. The display device of claim 17, wherein a reflectance of each of the plurality of sensing electrodes corresponding to the intersection areas is less than a reflectance of the first electrode.

* * * * *